US007649738B2

(12) United States Patent
Hata et al.

(10) Patent No.: US 7,649,738 B2
(45) Date of Patent: Jan. 19, 2010

(54) ELECTRONIC DEVICE

(75) Inventors: Yukihiko Hata, Tokyo (JP); Kentaro Tomioka, Tokyo (JP); Tatsuya Arakawa, Tokyo (JP); Kohei Wada, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/700,179

(22) Filed: Jan. 31, 2007

(65) Prior Publication Data

US 2007/0177350 A1    Aug. 2, 2007

(30) Foreign Application Priority Data

Jan. 31, 2006  (JP)  .............. 2006-022278

(51) Int. Cl.
*H05K 7/20* (2006.01)
*F28F 7/00* (2006.01)

(52) U.S. Cl. ............... 361/687; 165/80.2; 165/185; 165/104.33; 361/695; 361/679.48; 361/679.52; 361/700; 454/184

(58) Field of Classification Search ............ 361/690, 361/694–695, 697, 699–704, 687, 697.46–679.49, 361/679.52–679.55, 709, 719; 165/80.3–80.5, 165/104.33, 185; 174/15.2, 16.1, 16.3; 454/184
See application file for complete search history.

(56) References Cited

U.S. PATENT DOCUMENTS

| 6,728,102 | B2 * | 4/2004 | Ishikawa et al. | ............ 361/687 |
|---|---|---|---|---|
| 6,900,990 | B2 * | 5/2005 | Tomioka | ............ 361/752 |
| 6,920,043 | B1 * | 7/2005 | Ishikawa et al. | ............ 361/687 |
| 7,079,394 | B2 * | 7/2006 | Mok | ............ 361/700 |
| 7,317,614 | B2 * | 1/2008 | Ruch et al. | ............ 361/687 |
| 7,325,590 | B2 * | 2/2008 | Kim et al. | ............ 165/104.33 |
| 7,405,930 | B2 * | 7/2008 | Hongo et al. | ............ 361/679.48 |
| 7,460,370 | B2 * | 12/2008 | Cheng et al. | ............ 361/700 |
| 7,489,502 | B2 * | 2/2009 | Hong et al. | ............ 361/679.55 |
| 2004/0001316 | A1 * | 1/2004 | Kamikawa et al. | ............ 361/700 |
| 2005/0103477 | A1 | 5/2005 | Kim et al. | |
| 2005/0276018 | A1 * | 12/2005 | Moore et al. | ............ 361/695 |
| 2006/0002081 | A1 * | 1/2006 | Hongo et al. | ............ 361/691 |
| 2006/0039113 | A1 * | 2/2006 | Cheng et al. | ............ 361/700 |
| 2006/0077637 | A1 * | 4/2006 | Oshikawa | ............ 361/703 |
| 2006/0181851 | A1 * | 8/2006 | Frank et al. | ............ 361/700 |
| 2006/0232933 | A1 * | 10/2006 | Wang et al. | ............ 361/697 |
| 2006/0256520 | A1 * | 11/2006 | Chen | ............ 361/687 |

(Continued)

FOREIGN PATENT DOCUMENTS

JP    2000035291 A  *  2/2000

(Continued)

*Primary Examiner*—Jayprakash N Gandhi
*Assistant Examiner*—Robert J Hoffberg
(74) *Attorney, Agent, or Firm*—Pillsbury Winthrop Shaw Pittman, LLP

(57) ABSTRACT

An electronic device is provided with an enclosure having a side wall in which vent holes are formed, a heat generator stored in the enclosure, a radiator disposed adjacent to the vent holes, a heat receiver thermally connected to the heat generator, a heat transmission member having one end thermally connected to the heat receiver and the other end thermally connected to the radiator, a fan disposed adjacent to the radiator to generate cooling air toward the radiator, and a seal member that seals a gap formed between the radiator and the side wall having the vent holes formed therein.

8 Claims, 7 Drawing Sheets

U.S. PATENT DOCUMENTS

2007/0131383 A1 * 6/2007 Hattori et al. ............... 165/11.2
2008/0151500 A1 * 6/2008 Liang et al. ................. 361/697

FOREIGN PATENT DOCUMENTS

| | | | |
|---|---|---|---|
| JP | 2001217366 A | * | 8/2001 |
| JP | 2003-097892 A | | 4/2003 |
| JP | 2004-039685 A | | 2/2004 |
| JP | 2004-213655 A | | 7/2004 |
| JP | 2004-320021 A | | 11/2004 |
| JP | 2006-019384 A | | 1/2006 |
| JP | 2008250616 A | * | 10/2008 |

* cited by examiner

ELECTRONIC DEVICE

CROSS-REFERENCE TO RELATED APPLICATIONS

This application claims the benefit of priority of Japanese Patent Application No. 2006-22278, filed Jan. 31, 2006, the entire contents of which are incorporated herein by reference.

BACKGROUND

1. Field

The present invention relates to an electronic device, and more particularly to an electronic device which contains a heat generator such as a semiconductor, and a cooling unit for cooling the heat generator.

2. Description of the Related Art

Accompanied with the recent trend of speeding up of the information processing performed by an electronic device or a personal computer, the heat value of the semiconductor element such as CPU has been increasing. Accordingly, forced cooling of the semiconductor element has become indispensable for maintaining its performance.

Besides the CPU, the heat value of the semiconductor element for the high-speed signal processing, for example, a graphic controller used for image processing has been increasing. Recently, the number of the electronic device of type which contains a plurality of semiconductor elements requiring forced cooling in a single enclosure has been increasing.

The forced cooling of the CPU or the like has been performed in various ways. For example, the forced air cooling is performed by transmitting heat of a heat receiver thermally connected to the heat generator (CPU) to a radiator through a heat pipe so as to perform the forced cooling of the radiator using a fan and the like.

JP-A 2003-97892 discloses the electronic device as one of the aforementioned types of the technology. The disclosed electronic device is a notebook PC having its main body connected to a panel portion via hinges such that they are opened and closed. The main body contains components in a thin enclosure, for example, the heat generator such as the CPU and a cooling unit. Vent holes are formed in a side wall of the enclosure, and the cooling unit is disposed adjacent to the vent holes. Cooling air of the cooling unit is discharged outside the enclosure through those vent holes.

The cooling unit includes a radiator, a cooling fan, a heat pipe, and a heat receiver. The heat receiver at one end of the heat pipe is thermally connected to the heat generator (CPU). The other end of the heat pipe is thermally connected to the radiator such that the heat of the heat generator (CPU) is transmitted to the heat pipe via the heat receiver, and further transmitted to the radiator.

Heat exchange is performed between a plurality of fins of the radiator and cooling air generated by the cooling fan. The heated cooling air is discharged outside through the vent holes.

In the electronic device of the disclosed type, all the heated cooling air cannot be discharged outside the enclosure. The heated cooling air partially flows back into the enclosure.

The heated cooling air may be efficiently discharged by arranging the cooling fin and the radiator as adjacent to the vent holes (side wall) as possible. However, it is difficult to completely eliminate the gap between the side wall and the radiator in view of operability of assembling the cooling fin and the radiator with the enclosure or limitation in arrangement of the fixation member.

Part of the heated cooling air impinges against the wall of the vent hole, and passes through the gap to return into the enclosure as the flow back of the cooling air.

As a result, the temperature inside the enclosure increases to raise the temperature of the cooling air generated by the cooling fan. This may deteriorate the performance for cooling the heat generator. Accordingly, the cooling fan or radiator are required to be enlarged conforming to a predetermined requirement for the cooling performance.

The temperature rise in the enclosure may adversely affect other semiconductor elements and electronic parts which require no forced cooling.

SUMMARY OF THE INVENTION

Accordingly, it is an object of the present invention to provide an electronic device capable of reducing the flow back of the heated cooling air into the enclosure for improving the cooling efficiency and suppressing the temperature rise within the enclosure.

According to an aspect of the present invention, an electronic device includes an enclosure having a side wall in which vent holes are formed, a heat generator stored in the enclosure, a radiator disposed adjacent to the vent holes, a heat receiver thermally connected to the heat generator, a heat transmission member having one end thermally connected to the heat receiver and the other end thermally connected to the radiator, a fan disposed adjacent to the radiator to generate cooling air toward the radiator, and a seal member that seals a gap formed between the radiator and the side wall having the vent holes formed therein.

According to another aspect of the present invention, an electronic device includes an enclosure having a side wall in which vent holes are formed, a first heat generator stored in the enclosure, a second heat generator stored in the enclosure, a first radiator disposed adjacent to the vent holes, a second radiator disposed adjacent to the first radiator, a first heat receiver thermally connected to the first heat generator, a second heat receiver thermally connected to the second heat generator, a first heat pipe having one end thermally connected to the first heat receiver, and the other end thermally connected to the first radiator, a second heat pipe having one end thermally connected to the second heat receiver, and the other end thermally connected to the second radiator, a fan disposed adjacent to the second radiator to generate cooling air toward the first and the second radiators, and a seal plate that seals a first gap formed between the first radiator and the side wall in which the vent holes are formed, and a second gap formed between the first radiator and the second radiator.

According to another aspect of the present invention, an electronic device includes an enclosure, a first heat generator stored in the enclosure, a second heat generator stored in the enclosure, a first radiator disposed adjacent to the vent holes formed in a side wall that forms the enclosure, a second radiator disposed adjacent to the first radiator, a first heat receiver thermally connected to the first heat generator, a second heat receiver thermally connected to the second heat generator, a first heat pipe having one end thermally connected to the first heat receiver, and the other end thermally connected to the first radiator, a second heat pipe having one end thermally connected to the second heat receiver, and the other end thermally connected to the second radiator, a fan disposed adjacent to the second radiator, and generates cooling air for heat exchange with the first and the second radiators, a first seal plate that seals a first gap formed between the first radiator and the side wall having the vent holes formed therein, and a second seal plate that seals a second gap formed between the first radiator and the second radiator.

The electronic device according to the aspects of the present invention is capable of reducing the flow back of the heated cooling air into the enclosure for improving the cooling efficiency and suppressing the temperature rise in the enclosure.

BRIEF DESCRIPTION OF THE DRAWINGS

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION

Figure 1:
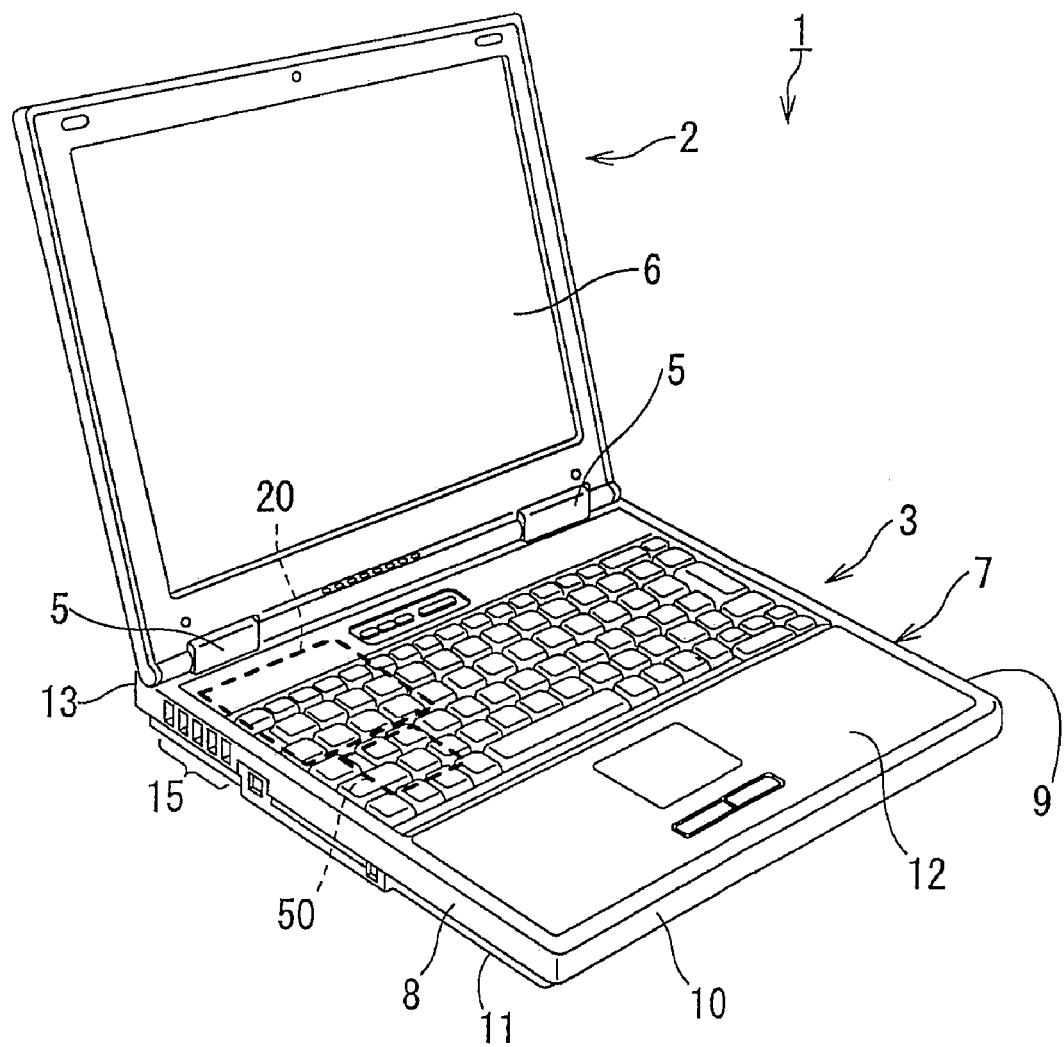
FIG. 1 is a perspective view of an exemplary appearance of an electronic device according to a first embodiment of the present invention.

An electronic device according to embodiments of the present invention will be described referring to the drawings.

(1) FIRST EMBODIMENT

FIG. 1 is a perspective view of an exemplary appearance of an electronic device 1 according to an embodiment of the present invention, for example, a notebook type personal computer.

The electronic device 1 includes a main body 3 and a panel portion 2 which are joined via hinges 5 so as to be opened and closed. The panel portion 2 includes a liquid crystal panel 6 on which various information data and images are displayed.

The main body 3 contains various components, for example, a heat generator 50 such as the CPU and the graphic controller, and a cooling unit 20 in a thin enclosure 7. The enclosure 7 is formed of side walls 8 and 9, a front wall 10, a bottom wall 11, an upper wall 12, and a rear wall 13.

A plurality of vent holes 15 are formed in the side wall 8, and the cooling unit 20 is disposed adjacent to those vent holes 15. The cooling unit 20 cools the heat generator 50, and the heated cooling air after cooling is discharged outside the enclosure 7 through the vent holes 15.

Figure 2:
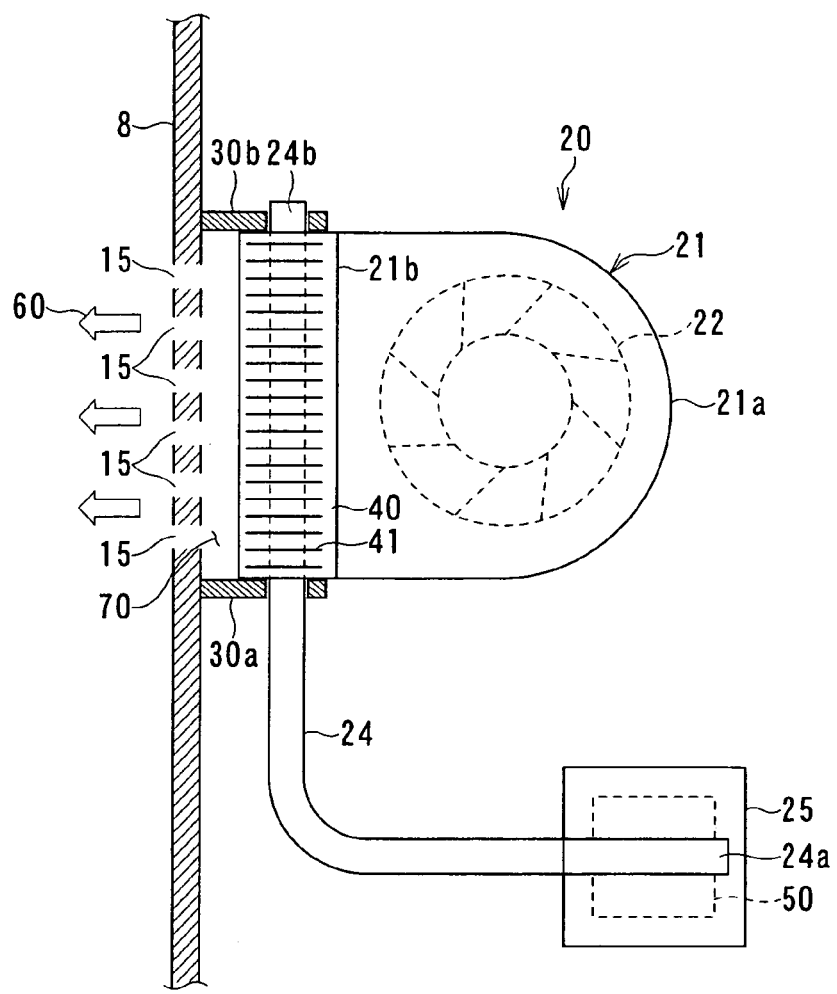
FIG. 2 is a plan view of a cooling unit and a cooling structure of the electronic device according to a first embodiment of the present invention.

FIG. 2 is a plan view showing the heat generator 50, the cooling unit 20, and a cooling structure therearound.

The cooling unit 20 includes a cooling fan (fan) 21, a radiator 40, a heat pipe 24 (heat transmission member), and a heat receiver 25.

The cooling fan 21 includes a rotary fan (fan) 22 driven by a motor (not shown) to rotate and a fan case 21a that stores the rotary fan 22.

The radiator 40 is disposed adjacent to the fan case 21a such that a fan opening 21b of the fan case 21a is covered. The radiator 40 is formed of, for example, a plurality of plate fins 41. The plate fin 41 is formed of a metal with high thermal conductivity, for example, aluminum, copper and the like.

The heat pipe 24 is a heat transmission member capable of transmitting heat at high speeds, and has its outer periphery covered with a metal such as copper. One end of the heat pipe 24, that is, 24a is thermally connected to the heat receiver 25. The heat receiver 25 formed of a metal with high heat transmission property such as copper is thermally connected to the heat generator 50 such as the CPU.

Meanwhile, the other end of the heat pipe 24, that is, 24b penetrates through the plate fins 41 of the radiator 40 and thermally connected thereto.

A plurality of vent holes 15 are formed in the side wall 8, through which heated cooling air 60 is discharged outside the enclosure 7.

The cooling fan 21 and a radiator 40 connected thereto are disposed adjacent to the vent holes 15 in the opposed position such that the heated cooling air 60 is efficiently discharged outside the enclosure 7. A small gap 70 exists between the side wall 8 and the radiator 40. It is difficult to completely eliminate the gap 70 between the side wall 8 and the radiator 40 considering the operability for assembly of the cooling fan 21 and the radiator 40 in the enclosure 7, or arrangement of the fixation member for fixing those components to the bottom wall 11.

Side seal plates (seal plate: seal member) 30a and 30b provided at both sides of the radiator 40 in the longitudinal direction, and a top seal plate (seal plate: seal member) 45 (see FIG. 3) serve to prevent the heated cooling air 60 from flowing back into the enclosure 7 through the gap 70. The side seal plates 30a, 30b and the top seal plate 45 make it possible to discharge the heated cooling air outside the enclosure 7 through the vent holes 15 efficiently while preventing the heated cooling air 60 from flowing back into the enclosure 7.

Figure 3:
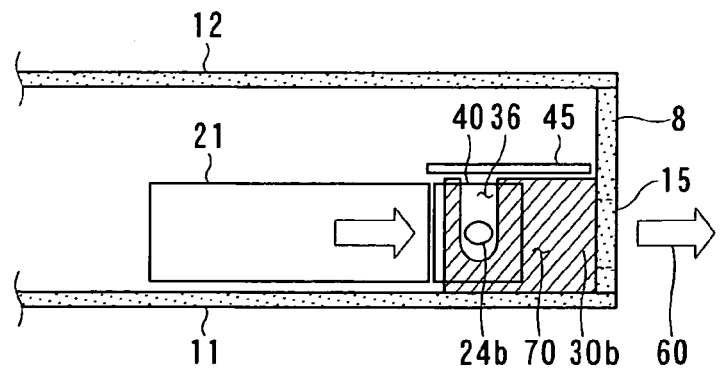
FIG. 3 is a side view of the cooling unit and the cooling structure of the electronic device according to the first embodiment of the present invention.

FIG. 3 is a side view of the cooling unit 20 and its cooling structure therearound.

The cooling fan 21 and the radiator 40 are disposed adjacent to the bottom wall 11 of the enclosure 7. The cooling air generated by the cooling fan 21 is subjected to the heat exchange with the plate fins 41 so as to be heated while passing through the gap between the adjacent plate fins 41 of the radiator 40. The heated cooling air 60 passes through the gap 70, and discharged outside the enclosure 7 through the vent holes 15 formed in the side wall 8.

At this time, the gap 70 is sealed by the side seal plates 30a and 30b (the side seal plate 30a opposite the side seal plate 30b is not shown in FIG. 3) and the top seal plate 45. Accordingly, the heated cooling air 60 does not flow back into the enclosure 7. Substantially all the heated cooling air 60 may be discharged outside the enclosure 7 through the vent holes 15.

Edge portions of the side seal plates 30a and 30b facing the bottom wall 11, and facing the side wall 8 may be connected to at least one of the bottom wall 11 and the side wall 8 so as to be integrally formed into a rib structure. The above structure is capable of reliably preventing leakage of the heated cooling air 60 through the gap 70. This makes it possible to simplify the work for assembling the side seal plates 30a and 30b, thus improving the operability.

A notch 36 is formed in each of the side seal plates 30a and 30b respectively as shown in FIG. 3. The notch 36 is formed to prevent the mechanical interference of the heat pipe 24 that penetrates the radiator 40 with the side seal plates 30a and 30b. In the presence of the mechanical interference of the heat pipe 24 with the side seal plates 30a and 30b, unnecessary force is exerted to the heat pipe 24. This may not only deform the heat pipe 24, but also give a stress on the heat receiver 25 or the heat generator 50 joined to one end 24a of the heat pipe 24, thus causing the separation. The notch 36 serves to solve the aforementioned problem.

Each of the side seal plates 30a and 30b is formed of a resin or lightweight alloy which is the same material as the one used for forming the enclosure 7. However, it is not limited to the one as described above.

As the top seal plate 45 is placed on the radiator 40, it does not have to exhibit the strength. Accordingly, it may be formed of a thin resin film, for example.

In the cooling unit 20 and the cooling structure of the electronic device 1 according to the first embodiment of the present invention, the gap 70 between the radiator 40 and the vent holes 15 is covered with the seal plates. This makes it possible to prevent the heated cooling air 60 from flowing back into the enclosure 7, and to suppress the temperature rise in the enclosure 7. As a result, the temperature of the cooling air generated by the cooling fan 21 is reduced compared with the generally employed electronic device, thus improving the performance for cooling the heat generator 50. It is possible to realize the predetermined cooling performance of the cooling unit 20 while reducing its size compared with the generally employed cooling unit as well as lower the power requirement.

The temperature rise in the enclosure 7 may also be suppressed, thus reducing the influence of the heat exerted to the semiconductor elements and electronic parts which require no forced cooling.

(2) SECOND EMBODIMENT

Figure 4:
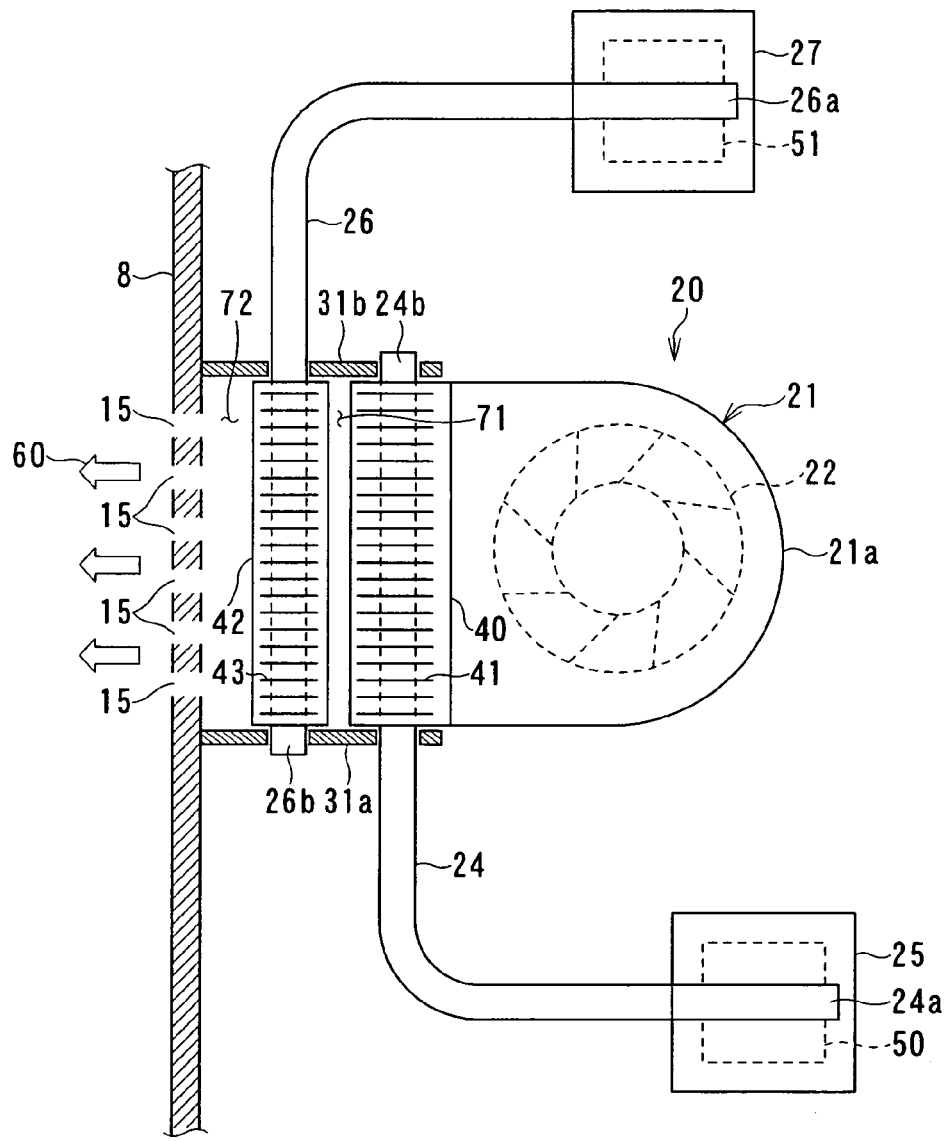
FIG. 4 is a plan view of a cooling unit and a cooling structure of an electronic device according to a second embodiment of the present invention.

FIG. 4 is a plan view of the cooling unit 20 and the cooling structure of the electronic device 1 according to a second embodiment of the present invention.

The second embodiment is substantially the same as the first embodiment except that two cooling systems are employed. That is, a cooling system for a first heat generator 51 includes a first radiator 42 disposed adjacent to the side wall 8, a first heat pipe 26 to which one end 26b of the first heat pipe 26 is thermally connected, and a first heat receiver 27 thermally connected to the other end 26a of the first heat pipe 26.

Likewise a cooling system for a second heat generator 50 includes a second radiator 40 disposed between the first radiator 42 and the cooling fan 21, the second heat pipe 24 having one end 24b thermally connected to the second radiator 40, and a second heat receiver 25 thermally connected to the other end 24a of the second heat pipe 24.

Each of the cooling systems has the same structure as the one described in the first embodiment, and explanation thereof, thus, will be omitted.

In the cooling structure of the electronic device according to the second embodiment, two gaps are formed, that is, a first gap 72 between the side wall 8 and the first radiator 42 and a second gap 71 between the first radiator 42 and the second radiator 40.

The seal plates employed in the second embodiment are structured to be able to prevent the heated cooling air 60 from flowing back through those two gaps. Specifically, side seal plates 31a and 31b, and top seal plates 46 and 47 (see FIG. 5) are employed.

Figure 5:
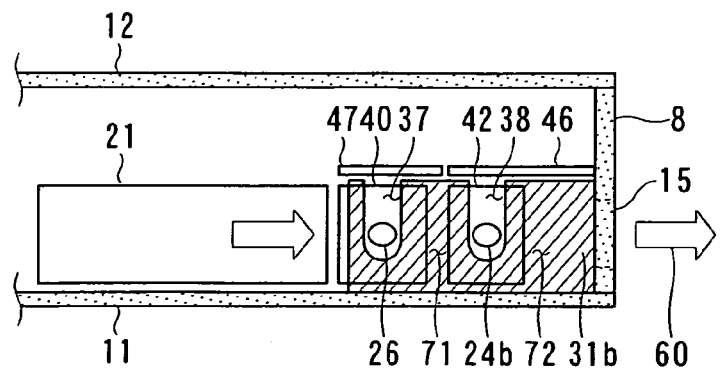
FIG. 5 is a side view of the cooling unit and the cooling structure of the electronic device according to the second embodiment of the present invention.

FIG. 5 is a side view of the cooling unit 20 and the cooling structure of the electronic device 1 according to the second embodiment of the present invention. Each of the side seal plates 31a and 31b (the side seal plate 31a opposite the side seal plate 31b is not shown in FIG. 5) is made longer in the cooling air flow direction than the one in the first embodiment for the purpose of covering both the first and the second gaps 72 and 71. Two notches 38 and 37 are formed in the side seal plates 31a and 31b, respectively so as to avoid the mechanical interference with the first and the second heat pipes 26 and 24, respectively.

In the embodiment, the top seal plate is separated into two top seal plates 46 and 47 to seal the two gaps 72 and 71, respectively. Those two top seal plates may be integrally formed into a single top seal plate.

In the cooling unit 20 and the cooling structure of the electronic device according to the second embodiment of the present invention, the effect derived from the first embodiment may be obtained as well as the effect for cooling a plurality of heat generators, for example the CPU and the graphic controller.

(3) THIRD EMBODIMENT

Figure 6:
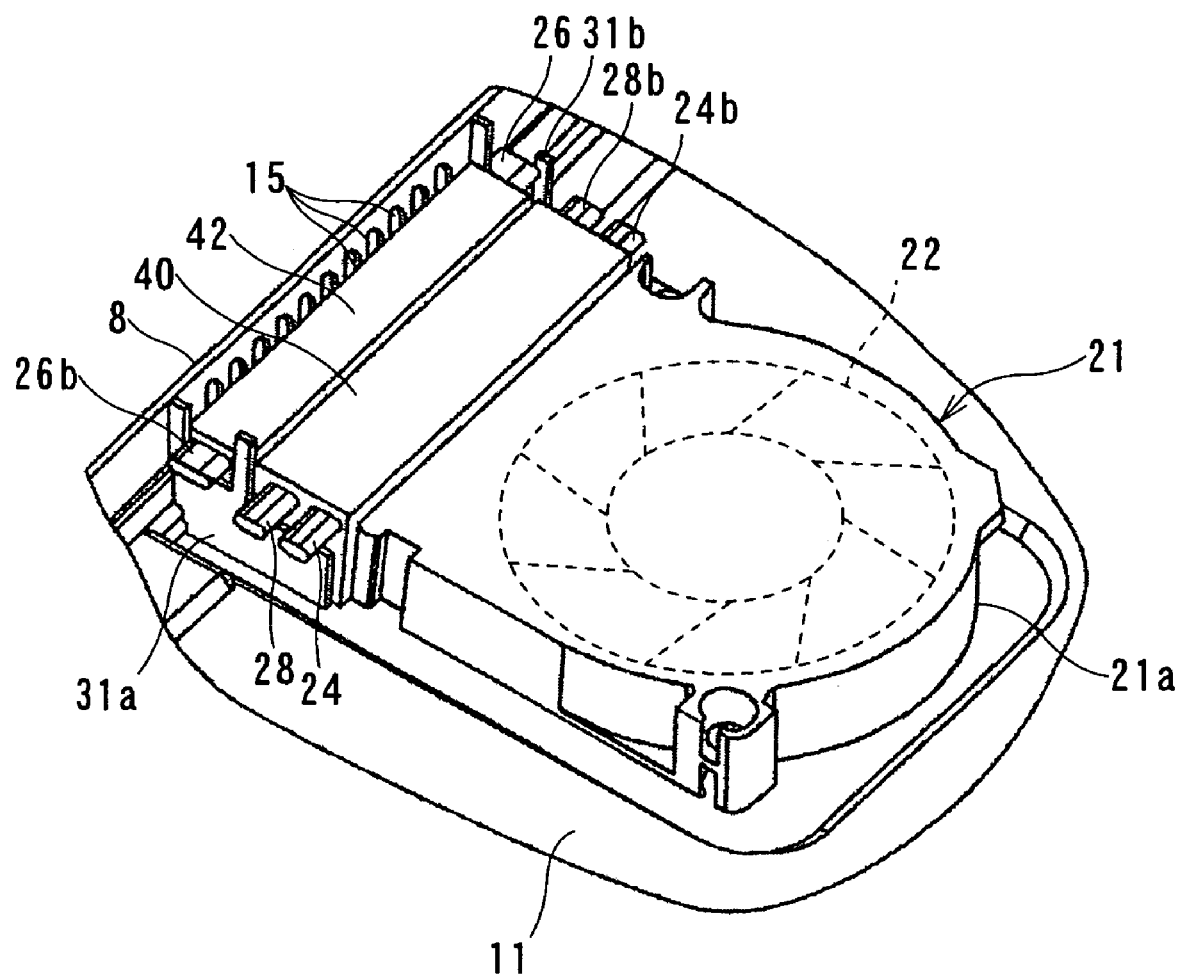
FIG. 6 is a perspective view of a cooling unit and a cooling structure of an electronic device according to a third embodiment of the present invention.

FIG. 6 is a perspective view of a cooling unit 20 and a cooling structure of an electronic device according to a third embodiment. In FIG. 6, the portion of the heat pipe extending from the radiator is not shown.

The third embodiment is substantially the same as the second embodiment except that two heat pipes are used to cool a single heat generator. More specifically, two heat pipes 24 and 28 penetrate through a second radiator 40 to transmit heat of one heat generator.

Figure 7:
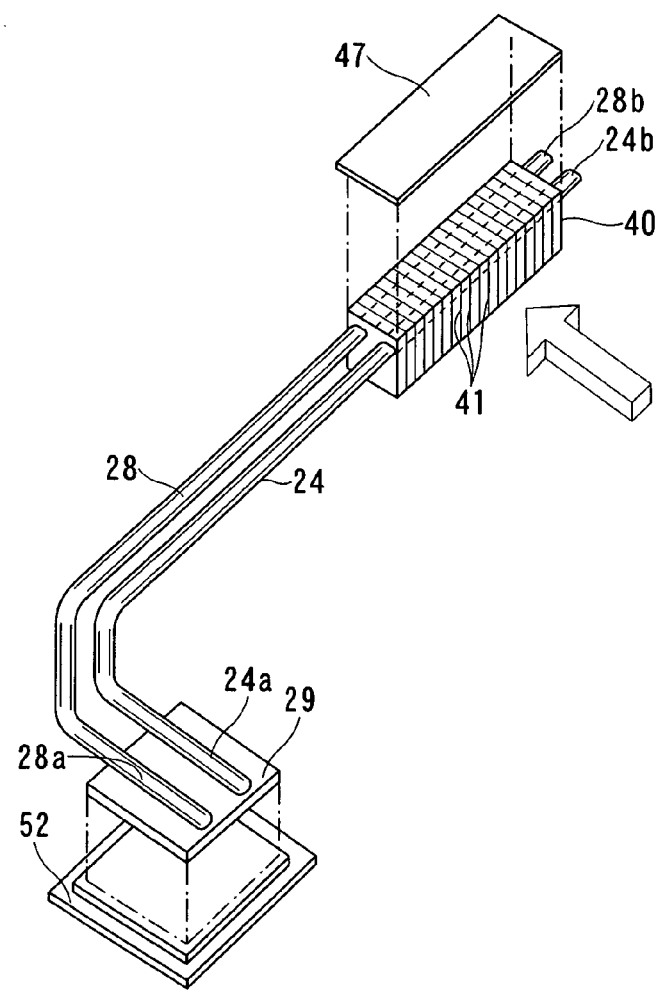
FIG. 7 is a perspective view showing a structure of a cooling system that relates to a second radiator according to the third embodiment of the present invention.

FIG. 7 is a perspective view of a cooling system that relates to the second radiator 40. A heat receiver 29 is thermally connected to one end 24a of the heat pipe 24 and a heat generator 52. It is further thermally connected to one end 28a of the heat pipe 28 and the heat generator 52.

The other ends 24b and 28b of the heat pipes 24 and 28 penetrate through the plate fins 41 of the second radiator 40. In the aforementioned cooling structure, heat generated in the heat generator 52 is transmitted to the second radiator 40 via those two heat pipes 24 and 28 so as to be cooled by the cooling fan 21.

A top seal plate 47 that covers the second radiator 40 from above serves to seal leakage of the cooling air from above the gap 71 (see FIG. 5) as well as leakage of the cooling air from above the gaps among the adjacent plate fins 41.

Figure 8:
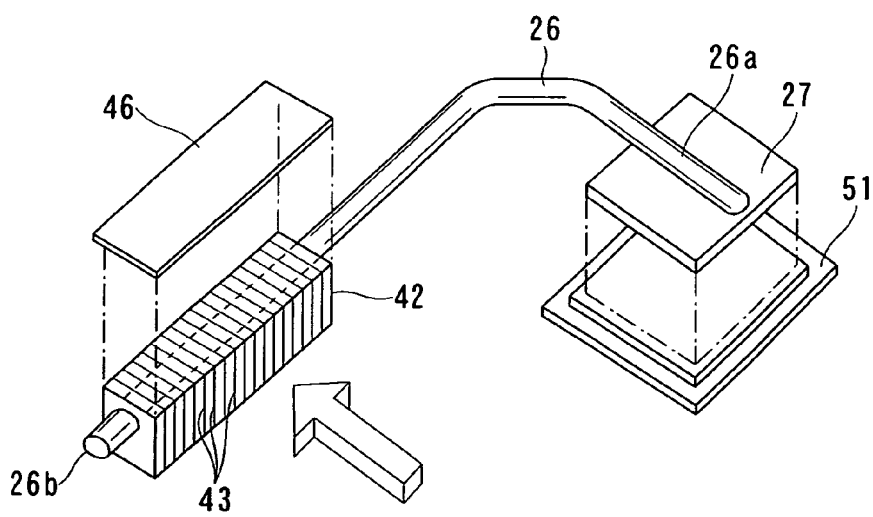
FIG. 8 is a perspective view showing a structure of a cooling system that relates to a first radiator according to the third embodiment of the present invention.

FIG. 8 is a perspective view of a cooling system that relates to a first radiator 42. A heat receiver 27 is thermally connected to one end 26a of the heat pipe 26 and a heat generator 51. The other end 26b of the heat pipe 26 penetrates through the plate fins 43 of the first radiator 42. A top seal plate 46 that covers the first radiator 42 from above serves to seal leakage of the cooling air from above the gap 72 between the first radiator 42 and the side wall 8 (see FIG. 5) as well as leakage of the cooling air from above the gaps among the adjacent plate fins 43.

Figure 9:
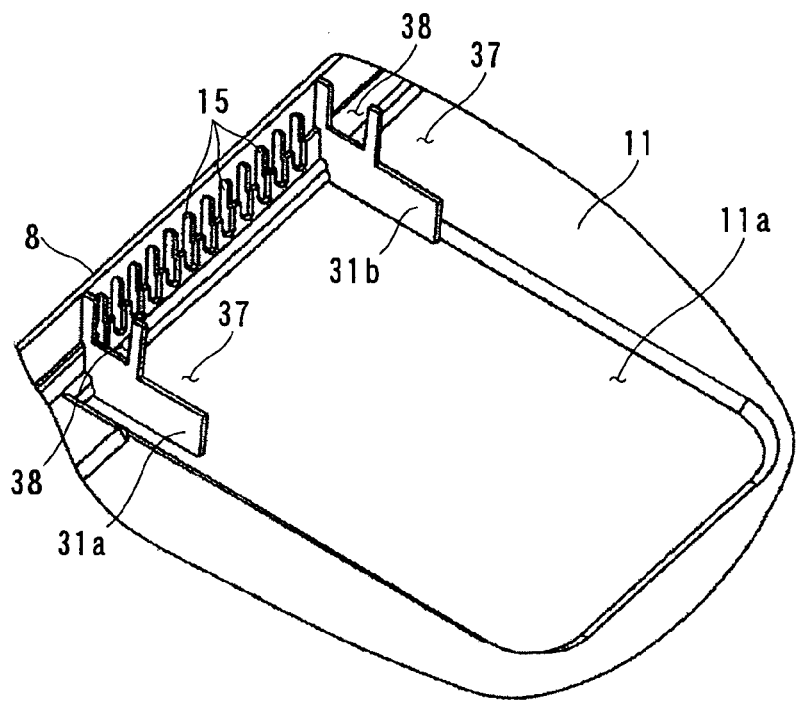
FIG. 9 is a perspective view of the third embodiment in a state where the cooling fan and the radiator are removed.

FIG. 9 is a perspective view of the cooling unit 20 and the cooling structure shown in FIG. 6 having the cooling fans 21, the first and the second radiators 42 and 40 omitted.

A recess portion 11a is formed in the bottom plate 11 for accommodating in contact with the cooling fan 21 and the first and the second radiators 42 and 40. The heated cooling air 60 hardly leaks from the lower portion on the path from the cooling fan 21 to the vent holes 15.

Each configuration of the notches 37 and 38 formed in the side seal plates 31a and 31b is slightly different from the one shown in FIG. 5. However, they provide the same effect of avoiding the mechanical interference with the heat pipes.

The cooling unit 20 and the cooling structure of the electronic device according to the third embodiment provide the effect of cooling more heat generators in addition to those derived from the second embodiment.

(4) OTHER EMBODIMENT

Figure 10:
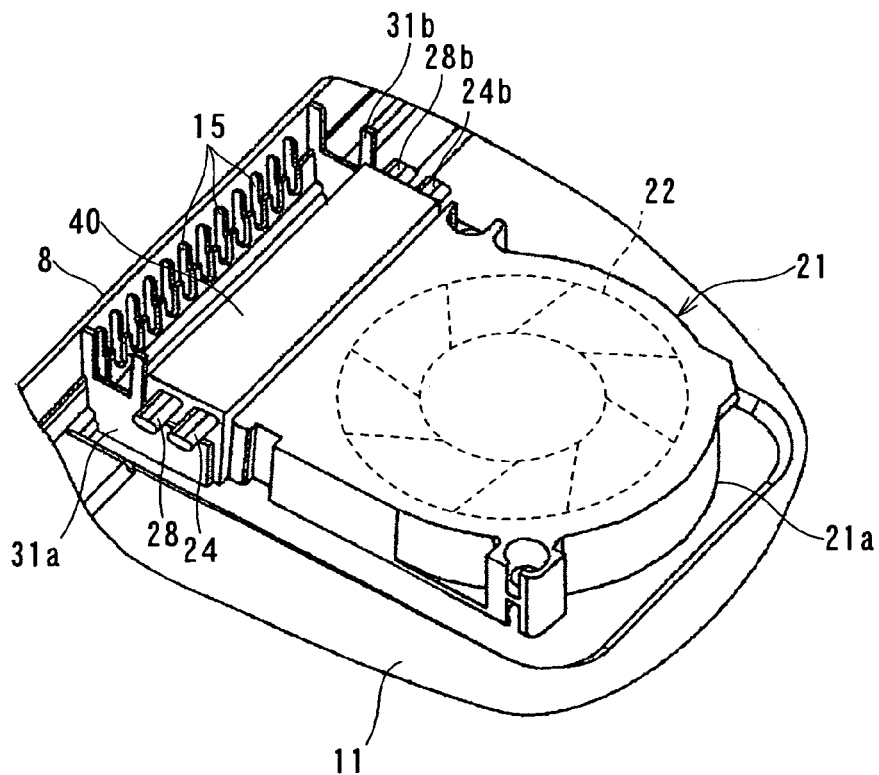
FIG. 10 is a perspective view of the third embodiment in a state where the cooling system that relates to the second radiator is removed.

FIG. 10 is a view that represents the third embodiment (see FIG. 6) having the cooling system that relates to the first radiator 42 removed. The number of the heat generators that require forced cooling varies depending on the model of the electronic device such as the personal computer. It is preferable to employ the structure that allows easy combination of the cooling systems in accordance with the number of heat generators that require forced cooling in view of cost reduction. In case of three heat generators that require forced cooling, for example, the structure as shown in FIG. 6 may be employed. In case of two heat generators that require forced cooling, the structure as shown in FIG. 10 where the cooling system that relates to the first radiator 42 is removed may be employed. The aforementioned structure allows parts of the cooling unit 20 or the cooling structure to be commonly used, thus contributing the cost reduction.

The chance of leakage of the heated cooling air 60 from the gap resultant from removing the first radiator 42 may be slightly increased. However, cooling performance may be improved by the side seal plates 31a and 31b compared with the generally employed cooling system.

Figure 11A:
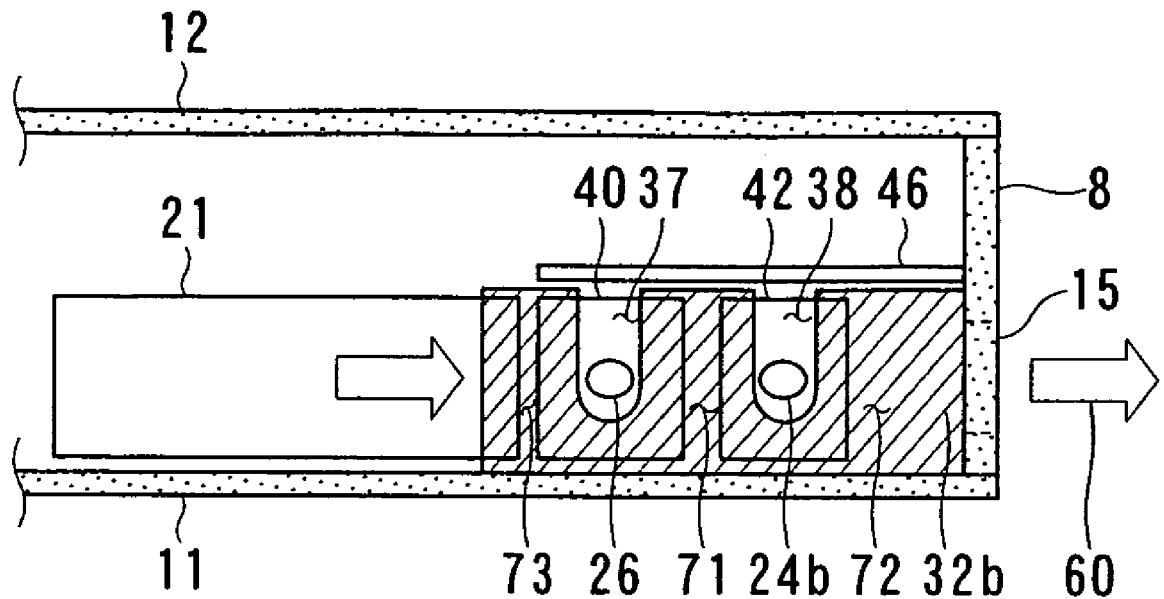
FIGS. 11A and 11B are side views each showing a configuration of a side seal plate according to another embodiment of the present invention.
Figure 11B:
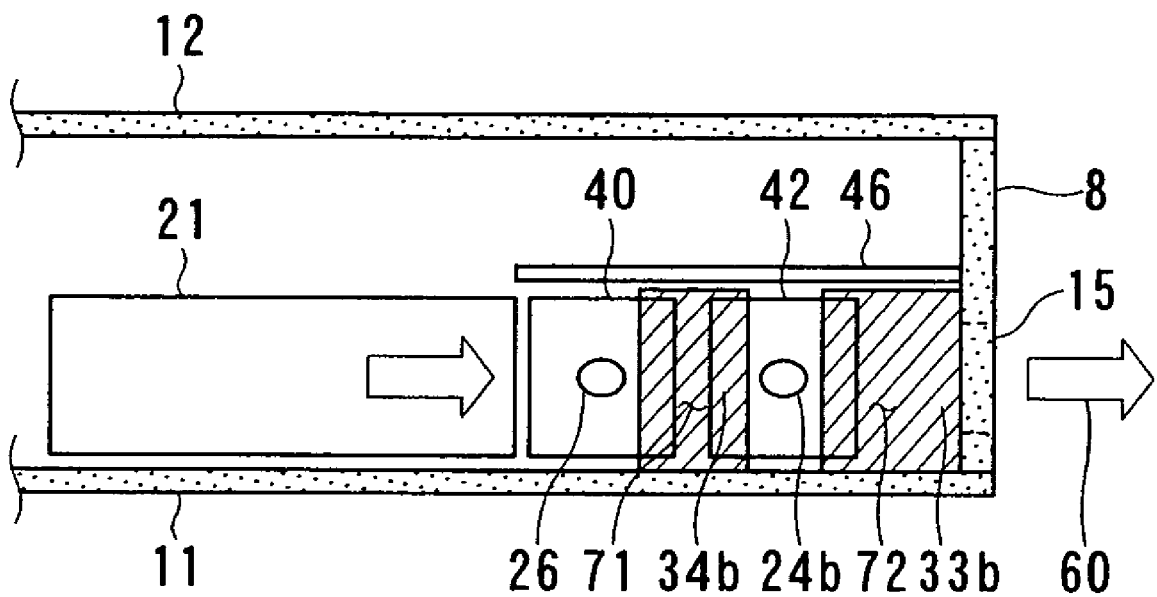

FIGS. 11A and 11B show configurations of the side seal plates according to another embodiments of the present invention.

The side seal plates 32b shown in FIG. 11A and the side seal plate 32a (the side seal plate 32a opposite the side seal plate 32b is not shown in FIG. 11A) are made longer along the flow direction of the cooling air than those in the second embodiment (see FIG. 5) so as to seal the gap 73 between the cooling fan 21 and the second radiator 40.

Although the gap 73 between the cooling fan 21 and the radiator 40 is not so large, the seal of this gap further suppresses the flow back of the heated cooling air 60 into the enclosure 7.

The top seal plate 46 may be formed as a single plate to seal the gaps 71 and 72 as shown in FIG. 11A. It may be further extended to seal the gap 73.

FIG. 11B represents the side seal plate of separate type. The first side seal plates 33a and 33b (the side seal plate 33a opposite the side seal plate 33b is not shown in FIG. 11B) serve to seal the first gap 72 between the side wall 8 and the first radiator 42. The second side seal plates 34a and 34b the side seal plate 34a opposite the side seal plate 34b is not shown in FIG. 11B) serve to seal the second gap 71 between the second radiator 40 and the first radiator 42.

The second side seal plates 34a and 34b may be extended vertically from the bottom wall 11 such that each lower edge portion of the second side seal plates 34a and 34b is connected to the bottom wall 11. Each lower edge of the first side seal plates 33a and 33b may be connected to the bottom wall 11, and one side edge thereof may further be connected to the side wall 8.

The aforementioned separate structure avoids the mechanical interference between the respective side seal plates and the heat pipe, thus requiring no notch.

In this case, the top seal plate 46 may be formed as a single plate that seals the gaps 71 and 72 from above as shown in FIG. 11B. It may further be extended to seal the gap 73.

The electronic device according to the embodiment suppresses the flow back of the heated cooling air into the enclosure to improve the cooling efficiency, and the temperature rise in the enclosure.

The present invention is not limited to the aforementioned embodiments, and may be realized by modifying the components without departing from the scope of the invention. A plurality of the components disclosed in the embodiments may be arbitrarily combined to make various embodiments of the invention. A certain components may be removed from all the components disclosed in the embodiments. Furthermore, components employed in different embodiments may also be arbitrarily combined.

What is claimed is:

1. An electronic device comprising:
    an enclosure having a side wall in which vent holes are formed;
    a first heat generator stored in the enclosure;
    a second heat generator stored in the enclosure;
    a first radiator disposed adjacent to the vent holes;
    a second radiator disposed adjacent to the first radiator;
    a first heat receiver thermally connected to the first heat generator;
    a second heat receiver thermally connected to the second heat generator;
    a first heat pipe having one end thermally connected to the first heat receiver, and the other end thermally connected to the first radiator;
    a second heat pipe having one end thermally connected to the second heat receiver, and the other end thermally connected to the second radiator;
    a fan disposed adjacent to the second radiator to generate cooling air toward the first and the second radiators; and
    a seal plate that seals a first gap formed between the first radiator and the side wall in which the vent holes are formed, and a second gap formed between the first radiator and the second radiator,
    wherein the second radiator is disposed between the first radiator and the fan,
    the cooling air flows from the fan to the vent holes serially through the second radiator and the first radiator,
    the seal plate is formed of two side seal plates that seal both sides of the first gap and the second gap, and a top seal plate that seal an upper portion of the first gap and the second gap,
    an edge portion of each of the side seal plates is formed to be connected to at least one of a bottom wall and the side wall having the vent holes formed therein of the enclosure so as to be integrally formed into a rib structure, and
    a recess portion is formed in the bottom wall of the enclosure for accommodating the fan, the first radiator, and the second radiator.

2. The electronic device according to claim 1, wherein:
  each of the first and the second radiators is provided with a plurality of plate fins; and
  the other end of each of the first and the second heat pipes penetrates through the plurality of plate fins, respectively.

3. The electronic device according to claim 1, wherein the seal plate is structured to further seal a gap formed between a fan case that stores the fan and the second radiator.

4. The electronic device according to claim 1, wherein a notch is formed in each of the side seal plates to avoid a mechanical interference with each of the first heat pipe and the second heat pipe.

5. An electronic device comprising:
  an enclosure;
  a first heat generator stored in the enclosure;
  a second heat generator stored in the enclosure;
  a first radiator disposed adjacent to vent holes formed in a side wall that forms the enclosure;
  a second radiator disposed adjacent to the first radiator;
  a first heat receiver thermally connected to the first heat generator; a second heat receiver thermally connected to the second heat generator;
  a first heat pipe having one end thermally connected to the first heat receiver, and the other end thermally connected to the first radiator;
  a second heat pipe having one end thermally connected to the second heat receiver, and the other end thermally connected to the second radiator;
  a fan disposed adjacent to the second radiator, and generates cooling air for heat exchange with the first and the second radiators;
  a first seal plate that seals a first gap formed between the first radiator and the side wall having the vent holes formed therein; and
  a second seal plate that seals a second gap formed between the first radiator and the second radiator,
  wherein the second radiator is disposed between the first radiator and the fan,
  the cooling air flows from the fan to the vent holes serially though the second radiator and the first radiator, and
  the first seal plate is formed of two side seal plates that seal both sides of the first gap, and a top seal plate that seal an upper portion of the first gap,
  an edge portion of each of the side seal plates of the first seal plate is formed to be connected to at least one of a bottom wall and the side wall having the vent holes formed therein of the enclosure so as to be integrally formed into a rib structure,
  the second seal plate is formed of two side seal plates that seal both sides of the second gap, and a top seal plate that seal an upper portion of the second gap,
  an edge portion of each of the side seal plates of the second seal plate is formed to be connected to a bottom wall so as to be integrally formed into a rib structure, and
  a recess portion is formed in a bottom wall of the enclosure for accommodating the fan, the first radiator, and the second radiator.

6. An electronic device comprising:
  an enclosure having a side wall in which vent holes are formed;
  a heat generator stored in the enclosure;
  a radiator disposed adjacent to the vent holes;
  a heat receiver thermally connected to the heat generator;
  a heat transmission member having one end thermally connected to the heat receiver and the other end thermally connected to the radiator;
  a fan disposed adjacent to the radiator to generate cooling air toward the radiator; and a seal member that seals a gap formed between the radiator and the side wall having the vent holes formed therein,
  wherein the radiator includes a plurality of plate fins, and the other end of the heat transmission member penetrates through the plurality of plate fins,
  wherein the seal member is formed to further seal a gap between a fan case that stores the fan and the radiator and comprises two side seal plates that seal both sides of the gap and a top seal plate that seal an upper portion of the gap,
  wherein the heat transmission member comprises a heat pipe, and a notch is formed in each of the side seal plates to avoid a mechanical interference with the heat pipe,
  wherein an edge portion of each of the side seal plates is formed to be connected to at least one of a bottom wall and the side wall having the vent holes formed therein of the enclosure so as to be integrally formed into a rib structure, and
  wherein a recess portion is formed in the bottom wall of the enclosure for accommodating the fan and the radiator.

7. An electronic device comprising:
  an enclosure comprising a side wall in which a vent hole is formed;
  a heat generator in the enclosure;
  a radiator provided adjacent to the vent holes; a heat receiver thermally connected to the heat generator;
  a heat pipe comprising a first end thermally connected to the heat receiver and a second end thermally connected to the radiator;
  a fan provided adjacent to the radiator to generate cooling air toward the radiator; two side seal plates sealing both sides of a gap formed between the radiator and the side wall; and
  a top seal plate sealing an upper portion of the gap, wherein, a recess portion is formed in a bottom wall of the enclosure for accommodating the fan and the radiator.

8. The electronic device according to claim 7, further comprising:
  a second heat stored in the enclosure; a second radiator provided between the radiator and the fan;
  a second heat receiver thermally connected to the second heat generator;
  a second heat pipe comprising a first end thermally connected to the second heat receiver and a second end thermally connected to the second radiator;
  wherein, the recess portion is formed in the bottom plate of the enclosure for further accommodating the second radiator.

* * * * *